US005518859A

United States Patent [19]

Iwasawa et al.

[11] Patent Number: 5,518,859

[45] Date of Patent: May 21, 1996

[54] POSITIVE-TYPE PHOTOSENSITIVE ELECTRODEPOSITION COATING COMPOSITION AND PROCESS FOR PRODUCING CIRCUIT PLATE

[75] Inventors: Naozumi Iwasawa, Hiratsuka; Junichi Higashi, Amagasaki, both, Japan

[73] Assignee: Kansai Paint Co., Ltd., Hyogo, Japan

[21] Appl. No.: 405,293

[22] Filed: Mar. 16, 1995

Related U.S. Application Data

[62] Division of Ser. No. 314,438, Sep. 28, 1994, Pat. No. 5,439,774, which is a continuation of Ser. No. 44,190, Apr. 8, 1993, abandoned.

[30] Foreign Application Priority Data

Apr. 10, 1992 [JP] Japan .................................... 4-116770

[51] Int. Cl.[6] .................................................. G03F 7/023

[52] U.S. Cl. ......................... 430/190; 430/191; 430/192; 430/193; 534/557

[58] Field of Search ................................... 430/192, 193, 430/190, 191; 534/557

[56] References Cited

U.S. PATENT DOCUMENTS

| | | | |
|---|---|---|---|
| 4,632,900 | 12/1986 | Demmer et al. | 430/323 |
| 4,673,458 | 6/1987 | Ishikawa et al. | 156/659 |
| 4,975,351 | 12/1990 | Akaki et al. | 430/190 |
| 5,134,054 | 7/1992 | Iwasawa et al. | 430/192 |
| 5,223,373 | 6/1993 | Lin et al. | 430/190 |

*Primary Examiner*—Charles L. Bowers, Jr.
*Assistant Examiner*—Christopher G. Young
*Attorney, Agent, or Firm*—Wenderoth, Lind & Ponack

[57] ABSTRACT

A positive-type photosensitive electrodeposition coating composition comprising a water-soluble or water-dispersible resin having an ionic group and containing at least one modified quinonediazidesulfone unit represented by the following formula (I) or (II)

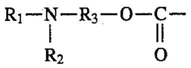

(I)

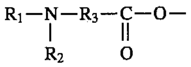

(II)

wherein $R_1$ represents

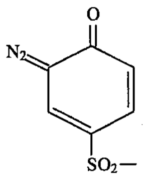

or

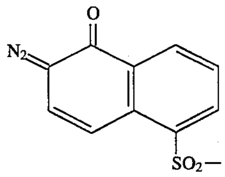

, $R_2$ represents a hydrogen atom, an alkyl group, a cycloalkyl group or an alkyl ether group, and $R_3$ represents an alkylene group, a cycloalkylene group, an alkylene ether group, a phenylene group which may optionally be substituted with an alkyl group having 1 to 20 carbon atoms, or an alkylene, cycloalkylene or alkylene ether group containing in its chain a phenylene group which may optionally be substituted with an alkyl group having 1 to 20 carbon atoms, in the molecule.

14 Claims, No Drawings

POSITIVE-TYPE PHOTOSENSITIVE ELECTRODEPOSITION COATING COMPOSITION AND PROCESS FOR PRODUCING CIRCUIT PLATE

This is a divisional application of Ser. No. 08/314,438, filed Sep. 28, 1994, U.S. Pat. No. 5,439,774, which was a continuation of now abandoned application Ser. No. 08/044,190 filed Apr. 8, 1993.

BACKGROUND OF THE INVENTION

1. Field of the Invention

This invention relates to a positive-type photosensitive electrodeposition coating composition, and more specifically, to an anionic or cationic electrodeposition coating composition suitable for forming a printed wiring photoresist by coating an electrically conductive material-clad laminated plate by electrodeposition to form a non-tacky smooth film whose portion exposed to actinic rays such as ultraviolet light through a positive photomask can be washed away with a developing solution.

2. Description of Related Art

In the prior art, a printed wiring board for use in an integrated circuit or the like is formed by plating a laminated plate obtained by cladding an insulator with an electrically conductive material such as a copper foil, laminating a photosensitive film, overlaying a photographic negative on it, exposing the photosensitive film through the negative, removing the unexposed portion, etching away the unnecessary electrically conductive material from the circuit pattern, and thereafter removing the photosensitive film on the circuit pattern. Since the photosensitive film is generally as thick as 50 micrometers, the circuit pattern formed by exposure and development is not sharp, and moreover, it is difficult to laminate the photosensitive film uniformly to the surface of the electrically conductive material. In particular, it is more difficult to protect the metal on through-hole portions with the photosensitive film.

A method is also known to form a circuit pattern for printed wiring which comprises applying an etching resist ink to a metal-clad laminated plate having a through-hole portion by screen printing, etching the laminated plate to remove metal from the non-printed portion, and removing the resist ink in the printed portion. According to this method, it is hard to form a pattern having a thickness of less than 200 micrometers with high reliability, the ink is difficult to coat on the through-hole portion, and the metal in the through-hole portion is frequently removed by the etching treatment. To avoid this, it is also the practice to embed an organic material in the through-hole portion so as to prevent the metal in the through-hole portion from being removed by the etching treatment, and finally remove the organic material. This method, however, has the defect that the cost of the circuit plate finally obtained is high and the circuit pattern has low sharpness.

As improvements over these prior methods, U.S. Pat. Nos. 4,632,900 and 4,673,458 disclose a method which comprises forming a positive-type photosensitive resin resist on a printed wiring board by electrodeposition, overlaying a photographic positive on it, exposing the board through the positive, and removing the exposed portion with an aqueous alkaline solution to form an image. Since according to this method, a coating can be formed easily on the through-hole portion by electrodeposition and the unexposed portion remains as a resist coating, a printed wiring board having excellent resolution can be obtained.

In the above-cited U.S. Pat. No. 4,632,900, polyoxymethylene polymer, o-nitrocarbinol ester, o-nitrophenyl acetal, and a quinonediazidesulfonyl ester of novolak resin are used as the resin in the resin composition for forming the photosensitive resin resist by electrodeposition. In U.S. Pat. No. 4,673,458, a resin obtained by esterifying a hydroxyl group contained in an unsaturated monomer with a sulfonic acid group contained in naphthoquinone diazidesulfonic acid, and copolymerizing the resulting unsaturated monomer with another unsaturated monomer is used as the above resin. However, the former method cannot produce a high-density fine pattern circuit board of sufficient reliability whichever resin may be used. Moreover, since the electrodeposition paint has insufficient stability, flocculation is liable to occur and tends to cause filter clogging or imperfections on the coated surface upon long-term running of the electrodeposition bath. In the latter method, a photosensitive naphthoquinone diazide group is introduced into the resin through a sulfonic acid ester group. Hence, when the electrodeposition is carried out over a long period of time (the turnover of the electrodeposition paint is long), the sulfonic acid ester group in the resin is easily hydrolyzed by a hydrolytic substance in the electrodeposition bath such as water, an acid, a base or an alcohol to degrade the resin frequently. As a result, the resin component flocculates in the electrodeposition bath or precipitates at the bottom of the bath. This causes filter clogging or greatly varies the electrodeposition characteristics such as application voltage. Alternatively, abnormal electrodeposition such as pinholing occurs, and the electrodeposition coating bath becomes difficult to control. Moreover, the coated film formed from the electrodeposition bath has poor smoothness and alkali developability, and it is impossible to obtain a printed wiring board having excellent resolution.

SUMMARY OF THE INVENTION

In order to solve these problems, the present inventors proposed anionic or cationic positive-type photosensitive electrodeposition coating composition comprising an ion forming group-containing resin which has a quinonediazide group connected thereto (See: U.S. Pat. No. 4,975,351), and a positive-type photosensitive electrodeposition coating composition comprising a photosensitive compound having a quinonediazide group and an acrylic resin having a salt-forming group (See: U.S. Pat. No. 5,134,054).

These compositions have high resistances to hydrolysis in the form of an electrodeposition coating bath, and the resulting electrodeposition baths are stable and can easily maintain the state of bath that can form highly reliable resist films after a prolonged running, and moreover they do not flocculate or precipitate in the running bath so that there will occur no clogging of a filter in an electrodeposition bath circulating apparatus, which makes it easy to control the bath. Therefore, they are positive-type photosensitive electrodeposition coating compositions which have high practical applicability.

However, since the aforementioned compositions have incorporated therein quinonediazide units through urethane bonds, they have large cohesive forces, and when they are in electrodeposition baths which are kept at low temperatures of 5° C. or lower for a long time, they tend to form precipitates in the baths. They require high development temperature and their development conditions are in narrow ranges. In an ordinary running state, electrodeposition baths are kept usually at 20° to 30° C. and there will occur no such problems as described above. However, it is undesirable to store them without keeping warmth while running is stopped, for example, in winter since there is a possibility that the temperature of the bath decreases to 5° C. or less.

To develop resist films obtained from the aforementioned compositions, development temperature must be set to 30° to 45° C. This causes various problems that water in the developer tends to evaporate, resulting in difficulty in controlling the concentration of the developer, much energy is required for keeping a high temperature, the resist films cannot be developed in the same line as conventional etching resists since the latter are developed at temperatures of 20° to 30° C., which is inconvenient, and so on.

As a result of intensive investigation, the present inventors have now found that incorporation of at least one quinonediazidesulfone unit in a resin through carboxylic acid ester bonds results in the following advantages: precipitation is difficult to occur in an electrodeposition bath at low temperatures, and an electrodeposition composition is obtained which can form a resist film that can be developed at a temperature range of 20° to 30° C. This invention has been completed based on this discovery.

DETAILED DESCRIPTION OF THE PREFERRED EMBODIMENTS

According to one aspect of this invention, there is provided a positive-type photosensitive electrodeposition coating composition comprising a water-soluble or water-dispersible resin having an ionic (ion-forming) group and containing at least one modified quinone diazide sulfone unit represented by the following formula (I) or (II)

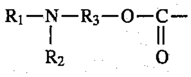 (I)

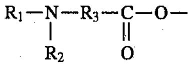 (II)

wherein $R_1$ represents

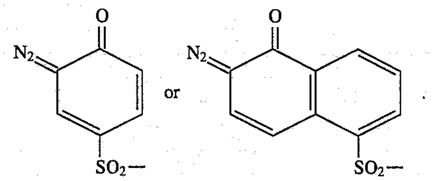

$R_2$ represents a hydrogen atom, an alkyl group, a cycloalkyl group or an alkyl ether group, and $R_3$ represents an alkylene group, a cycloalkylene group, an alkylene ether group, a phenylene group which may optionally be substituted with an alkyl group having 1 to 20 carbon atoms, or an alkylene, cycloalkylene or alkylene ether group containing in its chain a phenylene group which may optionally be substituted with an alkyl group having 1 to 20 carbon atoms, in a molecule.

According to another aspect of this invention, there is provided a positive-type photosensitive electrodeposition coating composition comprising: (A) a photosensitive compound or a photosensitive resin containing at least one modified quinonediazidesulfonic acid unit represented by the following formula (I) or (II)

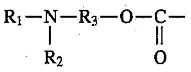 (I)

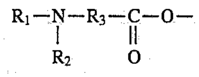 (II)

wherein $R_1$ represents

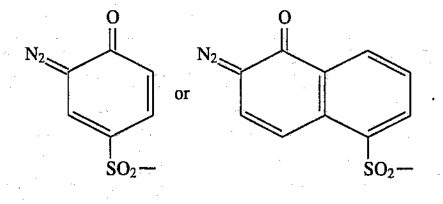

$R_2$ represents a hydrogen atom, an alkyl group, a cycloalkyl group or an alkyl ether group, and $R_3$ represents an alkylene group, a cycloalkylene group, an alkylene ether group, a phenylene group which may optionally be substituted with an alkyl group having 1 to 20 carbon atoms, or an alkylene, cycloalkylene or alkylene ether group containing in its chain a phenylene group which may optionally be substituted with an alkyl group having 1 to 20 carbon atoms, in a molecule and optionally having an ionic (ion-forming) group, and (B) a water-soluble or water-dispersible resin having a salt-forming group.

The "alkyl group" for $R_2$ in formula (I) or (II) may be linear or branched, and examples include alkyl groups having 1 to 15 carbon atoms, such as methyl, ethyl, n-propyl, isopropyl, n-butyl, isobutyl, sec-butyl, tert-butyl, n-pentyl, isopentyl, tert-pentyl, neopentyl, n-hexyl, isohexyl, 1-methylpentyl, 2-methylpentyl, n-heptyl, 5-methylhexyl, n-octyl, n-nonyl, n-decyl, dodecyl, tridecyl and tetradecyl groups.

Examples of the "cycloalkyl group" include cycloalkyl groups having 3 to 8 carbon atoms, such as cyclopropyl, cyclobutyl, cyclohexyl,

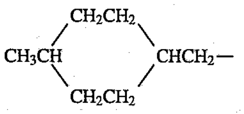

and

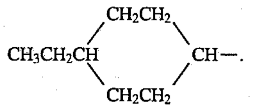

Examples of the "alkylether group" include (lower alkyl)-0-(lower alkylene) groups such as $CH_3OCH_2-$, $CH_3CH_2-O-CH_2CH_2-$, $CH_3CH_2CH_2-O-CH_2CH_2CH_2-$ and

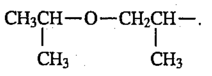

$R_2$ is preferably a lower alkyl group having 1 to 6 carbon atoms, especially a methyl group.

The "alkylene group" for $R_3$ may be linear or branched. Examples include alkylene groups having 1 to 8 carbon atoms, such as $-CH_2-$, $-CH_2CH_2-$, $-CH_2CH_2CH_2-$,

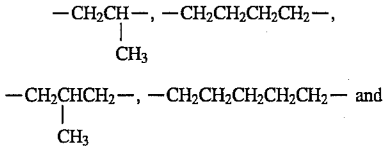

and $-CH_2CH_2CH_2CH_2CH_2CH_2-$.

Examples of the "cycloalkylene group" include cycloalkylene groups having 3 to 8 carbon atoms, such as cyclopropylene, cyclobutylene, cyclohexylene and

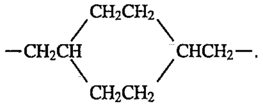

Examples of the "alkylene ether group" are (lower alkylene)-0-(lower alkylene) groups such as $-CH_2CH_2-O-CH_2CH_2-$, $-CH_2CH_2CH_2-O-CH_2CH_2CH_2-$, and

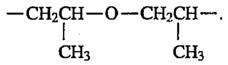

The "phenylene group which may optionally be substituted with an alkyl group having 1 to 20 carbon atoms" for $R_3$ preferably includes, for example, a phenylene group whose benzene nucleus may be substituted with 1 to 3 lower alkyl groups, such as those exemplified below:

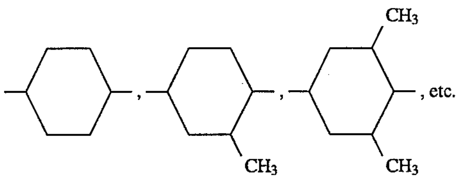

Suitable examples of the "an alkylene, cycloalkylene or alkylene ether group containing in its chain a phenylene group which may optionally be substituted with an alkyl group having 1 to 20 carbon atoms" includes the following:

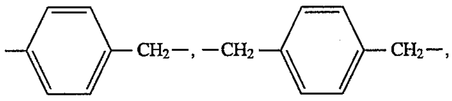

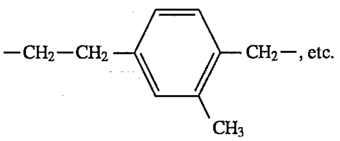

The positive-type photosensitive electrodeposition coating composition of this invention includes anionic or cationic compositions capable of forming a continuous film on an electrically conductive material by electrodeposition. When the continuous film is exposed, the exposed portion can be washed away with a developing solution.

In a first embodiment of this invention the resin containing the modified quinonediazidesulfonic acid units of general formula (I) used as a positive-type photosensitive component can be produced, for example, by the following methods.

First, a hydroxyl-containing quinonediazide compound represented by the following formula

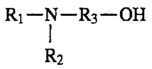

(VI)

wherein $R_1$, $R_2$ and $R_3$ are as defined above, is produced by addition-reaction between quinonediazidesulfonic acid and/or a quinonediazidesulfonyl halide (to be referred to as the "quinonediazide compound") represented by the following formula

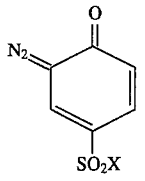

(III)

or

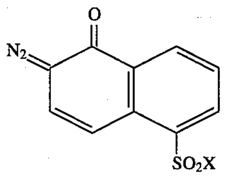

(IV)

wherein X represents a hydrogen atom or a halogen atom such as Cl, F, Br and I, and a hydroxyl-containing amine compound of the following formula

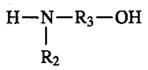

(V)

wherein $R_2$ and $R_3$ are as defined above.

Then, the photosensitive resin containing the quinonediazidesulfone units and ion-forming group represented by formula (I) above can be produced, for example, by the following methods.

(1) The hydroxyl-containing quinonediazide compound represented by formula (VI) is reacted with a resin containing at least one carboxyl halide group such as carboxyl chloride or carboxyl iodide in a molecule (for example, copolymers of a polymerizable unsaturated carboxylic acid halide, such as (meth)acryl chloride, (meth)acryl iodide, crotyl chloride or crotyl iodide, with a polymerizable unsaturated monomer which is non-reactive with the acid halide, resins obtained by halogenating carboxyl-containing acrylic resins, polyester resins, etc., whose carboxyl groups are halogenated with thionyl chloride or the like.). In this case, anionic carboxyl groups together with quinonediazidesulfonic groups can be introduced in the resin as ion-forming groups by using the carboxyl halide-containing resin in a number of moles excessive to the number of moles of the hydroxyl group in the hydroxyl-containing resin represented by formula (VI) above.

(2) After the amino group in the hydroxyl containing amine compound represented by formula (V) above is ketiminated, reaction is allowed to proceed between the carboxyl group or carboxylic anhydride group in the acrylic resin, polyester resin, or styrene/maleic anhydride copolymer, or ring open products thereof with water, alcohol or the like and the hydroxyl group in the ketiminated hydroxyl-containing amine compound. Next, the ketimine is hydrolyzed to reproduce amine groups, which then are reacted with the compound represented by formula (III) or (IV) above to introduce quinonediazidesulfone units in the resin. In this case, anionic carboxyl groups together with quinonediazidesulfonic groups can be introduced in the resin as ion-forming groups by using the carboxyl group-containing resin in a number of moles excessive to the number of moles of the hydroxyl group in the ketiminated hydroxyl-containing resin.

The photosensitive resin having an ion-forming group and at least one modified quinonediazidesulfone unit represented by general formula (II) above used as a positive-type photosensitive component in the positive-type photosensitive electrodeposition coating composition according to the first embodiment of this invention can be produced, for example, by the following methods.

(3) After the amino group in an aminocarboxylic acid represented by formula (VII) below $$H-\underset{\substack{| \\ R_2}}{N}-R_3-COOH \qquad (VII)$$

wherein $R_2$ and $R_3$ have the same meanings as defined above, is ketiminated, the reaction is allowed to proceed between an epoxy group in a resin containing at least one epoxy group in the molecule (for example, aromatic epoxy resins such as glycidyl ethers of aliphatic or alicyclic hydrocarbons, glycidyl etherated bisphenols, and glycidyl etherated product novolak resins of substituted or unsubstituted phenols, copolymers containing glycidyl-containing polymerizable unsaturated monomer such as glycidyl (meth-)acrylate, allyl glycidyl ether, and the like) and a carboxyl group in the ketiminated aminocarboxylic acid. Alternatively, reaction is allowed to proceed between a hydroxyl group in a resin containing at least one hydroxyl group in the molecule (for example, copolymers containing a hydroxyl-containing polymerizable unsaturated monomer such as 2-(meth)acrylate) and a carboxyl group in the ketiminated aminocarboxylic acid. Next, the ketimine is hydrolyzed to reproduce amino groups, which then are reacted with the compound represented by formula (III) or (IV) above to introduce quinonediazidesulfone units in the resin. In this case, cationic amino groups together with quinonediazidesulfonic groups can be introduced in the resin as ion-forming groups by reacting the ketiminated aminocarboxylic acid with the epoxy group or the hydroxyl group in the resin in such a proportion that the number of moles of the amino group is excessive to the number of moles of the quinonediazidesulfone units to be introduced, and then hydrolyzing the ketimine to reproduce amino groups.

The photosensitive compound or resin containing at least one modified quinonediazidesulfone unit represented by general formula (I) above used as a positive-type photosensitive component (A) in the positive-type photosensitive electrodeposition coating composition according to the second embodiment of this invention can be produced, for example, by the following methods.

(4) The hydroxyl-containing quinonediazide compound represented by formula (VI) is reacted with a compound containing at least one carboxyl halide group in a molecule (for example, halides such as chloride and iodide of aromatic or alicyclic carboxylic acids such as isophthalic acid, terephthalic acid, naphthalenecdicarboxylic acid or their hydrogenated products, similar halides of aliphatic carboxylic acids such as adipic acid, azelaic acid, sebacic acid, etc.) in such a manner that the content of hydroxyl groups is equimolar to that of carboxyl halide groups, or the number of moles of the carboxyl halide group is excessive to the number of moles of the hydroxyl group. Alternatively, the photosensitive compound or resin can be produced by reacting the carboxyl halide groups in the resin containing a carboxyl halide group as described in (1) above with the hydroxyl groups in the hydroxyl-containing quinonediazide compound in an equimolar ratio or with the number of moles of the carboxyl halide group being excessive to that of moles of the hydroxide.

(5) After the amino group in the hydroxyl-containing amine compound represented by formula (V) above is ketiminated, reaction is allowed to proceed between the carboxyl group or carboxylic anhydride group in a compound containing at least one carboxyl group in the molecule (for example, aromatic or alicyclic dicarboxylic acids such as isophthalic acid, terephthalic acid, naphthalenedicarboxylic acid or their anhydrides, or their hydrogenated products, aliphatic dicarboxylic acids such as adipic acid, azelaic acid, sebacic acid, etc., or their anhydrides) and the hydroxyl group in the ketiminated hydroxyl-containing amine compound in an equimolar ratio or with the number of moles of the carboxyl halide group being excessive to that of moles of the hydroxide. Next, the ketimine is hydrolyzed to reproduce amino groups, which then are reacted with the compound represented by formula (III) or (IV) above to introduce quinonediazidesulfone units in the resin. Alternatively, the photosensitive compound or resin can be produced by allowing reaction between the carboxyl groups or carboxylic anhydride groups in the resin containing carboxyl groups as described in (2) above and the hydroxyl group in the ketiminated hydroxyl-containing amine compound in an equimolar proportion or with the number of moles of the carboxyl group or carboxylic anhydride group being excessive to the number of moles of the hydroxyl group, hydrolyzing the ketimine to reproduce amino groups, and then reacting the amino groups with the compound represented by formula (III) or (IV) above to introduce the quinonediazidesulfone units in the resin.

The photosensitive compound or photosensitive resin containing at least one modified quinonediazidesulfone unit represented by general formula (II) above used as a positive-type photosensitive component (A) in the positive-type photosensitive electrodeposition coating composition according to the second embodiment of this invention can be produced, for example, by the following methods.

(6) After the amino group in the hydroxyl-containing amine compound represented by formula (VII) above is ketiminated, reaction is allowed to proceed between the epoxy group in a compound containing at least one epoxy group in the molecule (for example, ethylene glycol diglycidyl ether, bis(4-hydroxyphenyl) dimethylmethane diglycidyl ether, diglycidyl isophthalate, neopentyl glycol diglycidyl ether, etc.) and the carboxyl group in the ketiminated aminocarboxylic acid in an equimolar ratio. Alternatively, reaction is allowed to proceed between the hydroxyl group in a compound having at least one hydroxyl group (for example, bis(4-hydroxylphenyl)dimethylmethane, neopentyl glycol, 1,6-hexanediol, etc.) and the carboxyl group in the ketiminated aminocarboxylic acid in an equimolar ratio. Next, the ketimine is hydrolyzed to reproduce amino groups, which then are reacted with the compound represented by formula (III) or (IV) above in an equimolar proportion or with the number of moles of the amino group being excessive to the number of moles of the equinonediazidesulfone units to introduce the quinonediazidesulfone units in the resin. Alternatively, the photosensitive compound or resin can be produced by allowing reaction between the epoxy groups or hydroxyl groups in the resin containing epoxy groups or hydroxyl groups as described in (3) above and the carboxyl group in the ketiminated aminocarboxylic acid in an equimolar ratio, and then reacting the amino groups with the compound represented by formula (III) or (IV) above in an equimolar ratio or with the number of moles of the amino group being excessive to the number of moles of the quinonediazidesulfone unit to introduce the quinonediazidesulfone units in the resin.

When a water-soluble or water-dispersible resin containing a photosensitive group and an ion-forming group is used as a positive type photosensitive component or photosensitive film forming component in the composition of this invention thus obtained, the photosensitive group to be used contains at least one quinonediazidesulfone unit represented by formula (I) or (II) above, preferably in average 1.5, more preferably within the range of 2 to 5, quinonediazidesulfone units per molecule. The content of the ion-forming group is within the range of generally 0.45 to 4.0 moles/kg resin solid component, and particularly 0.5 to 1.6 moles/kg resin solid component for both anion-forming group and cation-forming group. If the content of the ion-forming group is less than 0.45 mole/kg resin solid component, generally the resin is difficult to neutralize and dissolve or disperse in water, which makes it difficult to obtain a stable electrodeposition coating bath. On the other hand, if the content of the ion-forming group exceeds 4.0 moles/kg resin solid content, coating efficiency (Coulomb yield) at the time of electrodeposition coating is low, which is undesirable from a viewpoint of energy saving, and moreover coating film abnormality such as water traces tend to appear on the surface of the resultant resist film.

It is preferred that the number average molecular weight of the resin is within the range of 1,500 to 100,000, particularly 5,000 to 30,000. If the number average molecular weight is below 1,500, the film has insufficient strength and hence the film tends to cause cracks or deficiency in the resist film during development or etching step while if it exceeds 100,000, the flow leveling of the coating film is insufficient resulting in difficulty in obtaining smooth coated surfaces when films are formed by electrodeposition coating. While the content of the photosensitive group is not limited strictly, it is generally preferred that the content of quinonediazidesulfone unit is within the range of 0.1 to 1.0 mole, particularly 0.2 to 0.8 mole, per kg resin solid component. If the content of the photosensitive group is less than 0.1 mole/kg resin solid component, difference in solubility in developer between an exposed portion and an unexposed portion is small, tending to give a narrow development condition range. If it exceeds 1.0 mole/kg resin solid component, the light transmittance of the resist film tends to decrease to lower photosensitivity. Furthermore, since the quinonediazide-containing compounds are expensive, it is economically undesirable to use them more than necessary.

When the resin has anionic carboxylic groups as an ion-forming group, usually, they can be neutralized with an amine or an alkali compound, and dissolved or dispersed in water before use.

Examples of the neutralizing agent used include alkanolamines such as monoethanolamine, diethanolamine and triethanolamine, alkylamines such as triethylamine, diethylamine, monoethylamine, diisopropylamine, trimethylamine and diisobutylamine, alkylalkanolamines such as dimethylaminoethanol, alicyclic amines such as cyclohexylamine, alkali metal hydroxide such as sodium hydroxide and potassium hydroxide, ammonia. They may be used either singly or as a mixture.

On the other hand, when the resin has cationic amino groups as an ion-forming group, usually, they are neutralized with an organic Acid or an inorganic acid, and dissolved or dispersed in water before use. Examples of the neutralizing agent used then include organic acids such as acetic acid, and lactic acid; and inorganic acids such as phosphoric acid.

In another embodiment of this invention, the photosensitive compound or photosensitive resin used as the positive-type photosensitive component (A) contains at least one quinonediazidesulfone unit represented by formula (I) or (II) above, preferably in average 1.5, more preferably within the range of 2 to 5, quinonediazidesulfone units per molecule, and may optionally contain an ion-forming group. When the photosensitive resin is used as the photosensitive component (A), those resins are used advantageously that have a number average molecular weight within the range of 50,000 or less, preferably 1,500 to 30,000, more preferably 2,000 to 25,000. If a resin is used that has a number average molecular weight exceeding 5,000, generally compatibility of the resin with water-soluble or water-dispersible resin (B) to be used in combination tends to decrease, resulting in deteriorated stability of the resultant coating composition. Meanwhile the water-soluble or water-dispersible resin (B) having the salt-forming group [to be referred to as a "resin (B)"], used in this invention, includes a resin having a group capable of forming a salt by e.g. neutralization.

Examples of the resin (B) include a carboxyl group-containing acrylic resin, an amino group-containing acrylic resin, an ammonium salt, a sulfonium salt-containing acrylic resin, a carboxyl group-containing polyester resin, an epoxy resin amine adduct and an onium chloride epoxy resin.

Examples of the salt-forming group when the composition of this invention is used as an anionic electrodeposition coating are anion-forming groups such as a carboxyl group, a sulfonyl group and a phosphoric acid group. Above all, the carboxyl group is preferable. On the other hand, examples of the salt-forming group when the composition of this invention is used as a cationic electrodeposition coating are cation-forming groups such as amino group, an ammonium salt group, a sulfonium group and a phosphonium salt group.

It is preferred that the content of the salt-forming group in the resin (B) is adjusted such that the amount of the salt-forming group in the total composition of the photosensitive component (A) and the resin (B) is within the range of 0.45 to 4.0 moles/kg, particularly 0.5 to 1.6 moles/kg. If the total content of the salt-forming group is less than 0.45 mole/kg, generally it is likely that the resin is difficult no neutralize, and dissolve or disperse in water. As a result, it is often difficult to obtain a stable electrodeposition coating bath. If the total content of the salt-forming group exceeds 4.0 moles/kg, generally coating efficiency (Coulomb yield) at the time of electrodeposition coating tends to decrease, and cause coating film abnormality such as water trace on the surface of the resultant resist film.

Further, it is preferred that the number average molecular weight of the resin (B) is within the range of 1,500 to 100,000, particularly 5,000 to 30,000. If the number average molecular weight of the resin (B) is below 1,500, the film strength is insufficient and hence the film tends to cause cracks or deficiency in the resist film during development or etching step while if it exceeds 100,000, the flow leveling of the coating film is insufficient resulting in difficulty in obtaining smooth coated surfaces when films are formed by electrodeposition coating.

Mixing proportion of the photosensitive component (A) and the resin (B) is not limited strictly and may vary within a wide range depending on the kinds of the photosensitive component (A) and/or the resin (B) and the like. From viewpoints of developability, photosensitivity, stability of electrodeposition bath, workability of coating, etc., it is generally preferred to mix them such that the content of quinonediazidesulfone unit is within the range of 0.1 to 1.0 mole, particularly 0.2 to 0.8 mole, per kg resin solid component, and that the content of the ion-forming group, either for anion-forming group or for cation-forming group, is within the range of 0.45 to 4.0 moles, particularly 0.5 to 1.6 moles. If the content of the photosensitive group is less than 0.1 mole/kg resin solid component, difference in solubility in developer between an exposed portion and an unexposed portion is small, tending to give a narrow development condition range. If it exceeds 1.0 mole/kg resin solid component, the light transmittance of the resist film tends to decrease to lower photosensitivity. Since the quinonediazide-containing compounds are expensive, it is economically undesirable to use them more than necessary. Furthermore, if the content of the ion-forming group is less than 0.45 mole/kg resin solid component, generally the resin is difficult to neutralize and dissolve or disperse in water, which makes it difficult to obtain a stable electrodeposition coating bath. On the other hand, if the content of the ion-forming group exceeds 4.0 moles/kg resin solid content, coating efficiency (Coulomb yield) at the time of electrodeposition coating is low, and also coating film abnormality such as water trace tends to appear on the surface of the resultant resist film.

One or more of the photosensitive compounds or photosensitive resins used as the photosensitive component (A) may be used as mixtures with the resin (B). Resins containing no salt-forming group such as phenol resins may be blended in amounts of less than 50 parts by weight per 100 parts by weight of total composition as the case may be.

The electrodeposition coating composition in this invention is obtained such that when the resin (B) contains the anionic group, it is neutralized with an amine or alkali compound and when the resin (B) contains the cationic group, it is neutralized with an organic or inorganic acid, and then dispersed or dissolved in water. When the cationic group is a quaternary ammonium salt group, a quaternary phosphonium salt group or a sulfonium salt, it can also be dispersed or dissolved in water as such. Examples of the neutralizing agent used include alkanolamines such as monoethanolamine, diethanolamine and triethanolamine, alkylamines such as triethylamine, diethylamine, monoethylamine, diisopropylamine, trimethylamine and diisobutylamine, alkylalkanolamines such as dimethylaminoethanol, alicyclic amines such as cyclohexylamine, alkali metal hydroxide such as sodium hydroxide and potassium hydroxide, ammonia; and also acids such as acetic acid, lactic acid, hydrochloric acid and phosphoric acid. They may be used either singly or as a mixture.

A hydrophilic solvent may be added to the electrodeposition coating composition in order to increase the flowability of the water-solubilized or water-dispersed electrodeposition paint further. Examples of the hydrophilic solvent are isopropanol, n-butanol, t-butanol, methoxyethanol, ethoxyethanol, butoxyethanol, ethylene glycol dimethyl ether, diethylene glycol methyl ether, dioxane and tetrahydrofuran. Generally, the amount of the hydrophilic solvent used is desirably not more than 100 parts by weight per 100 parts by weight of the solid component.

To increase the amount of the coating composition coated on the substrate, a hydrophobic solvent may also be added to the composition. Examples of the hydrophobic solvent include petroleum solvents such as toluene and xylene, ketones such as methyl ethyl ketone and methyl isobutyl ketone, esters such as ethyl acetate and butyl acetate, hydrophobic alcohols such as 2-ethylhexyl alcohol and benzyl alcohol, and hydrophobic ethers such as ethylene glycol dibutyl ether and diethylene glycol dibutyl ether. Usually, the amount of the hydrophobic solvent is desirably not more than 30 parts by weight per 100 parts by weight of the solid component.

As required, other resins may be incorporated to adjust the properties of the electrodeposited film. It is also possible to add a dye or a pigment.

Production of the printed wiring substrate using the positive-type electrodeposition coating composition in this invention is performed as follows.

In an electrodeposition coating bath (a solids content in the bath: 3 to 30% by weight) is dipped a printed wiring substrate (e.g. a copper-clad plate) as an anode in the anionic electrodeposition coating or as a cathode in the cationic electrodeposition coating. A DC current of 20 to 400 V is passed. The suitable passing time is 30 seconds to 5 minutes. The film thickness is 2 to 100 micrometers, preferably 3 to 20 micrometers as a dry film thickness.

After the electrodeposition coating, the coated product is withdrawn from the electrodeposition bath, and washed with water, followed by removing the moisture contained in the electrodeposited film with hot air, etc.

Subsequently, the surface of the thus formed photosensitive electrodeposited film is irradiated with actinic rays such as ultraviolet rays via a pattern mask (positive). As the ortho-quinonediazide compound in the exposed portion becomes a carboxylic acid via a ketene, it is removed by the developing treatment with a developer such as an alkali aqueous solution, making it possible to realize a high resolution.

The actinic light used for exposure in this invention preferably has a wavelength of 3000 to 4500 Å. Sources of this light are, for example, solar light, a mercury lamp, a xenone lamp and an arc light. Irradiation of the actinic light is carried out usually in an irradiation dose of 50 to 800 $mj/cm^2$, preferably 50 to 500 $mj/cm^2$.

The developing treatment is carried out by spraying weakly alkaline water against the surface of the coated film to wash away the exposed portions of the coated film. The weakly alkaline water may be, for example, sodium hydroxide, potassium hydroxide, sodium metasilicate, sodium carbonate, organic amine or aqueous ammonia, which has pH of 8 to 12, and which neutralizes the free carboxylic acid in the coated film to make it water-soluble.

The metal portion (non-circuit portion) exposed on the substrate by the development is removed by an ordinary etching treatment using a ferric chloride, cupric chloride solution or ammonium chloride/ammonia etching solution, for example. Then, the unexposed coated film on the circuit pattern is removed by dissolving with a Cellosolve-type solvent such as ethyl Cellosolve and ethyl Cellosolve acetate, an aromatic hydrocarbon solvent such as toluene and xylene, a ketone-type solvent such as methyl ethyl ketone and methyl isobutyl ketone, an acetate-type solvent such as ethyl acetate and butyl acetate, or a chlorine-type solvent such as trichloroethylene, or also with a sodium hydroxide, potassium hydroxide, sodium carbonate or sodium metasilicate aqueous solution of pH 8 or more in the case of using an anionic electrodeposition paint, or also with an organic acid such as acetic acid or lactic acid in the case of using a cationic electrodeposition paint.

The positive-type photosensitive electrodeposition coating composition can be easily coated on a electrically conductive materials such as copper foil by electrodeposition, and the electrodeposited film is dried to form a uniform photosensitive film. When light is irradiated onto the photosensitive film through a positive film, the exposed portion changes as described above and is developed with weakly alkaline water. The unexposed portion can also be removed by dissolving with the solvent, alkali solution (in the case of using the anionic paint) or the acid (in the case of using the cationic paint). Accordingly, this can supersede conventional photosensitive films.

The electrodeposition coating composition of this invention is particularly suitable for the production of a printed circuit board having through-holes. This composition obviates a soldering step unlike the case of using a photosensitive dry film, and shortens the process of producing the printed circuit board. With a photocurable negative-type electrodeposition paint, it is difficult to form a cured film on through-holes of small diameters. In contrast, since the unexposed portion remains as a resist film in the present invention, the composition of this invention is suitable for the production of printed circuit board having through-holes of a small diameter.

Using the composition in this invention, the printed wiring substrate having landless through-holes can easily be produced by exposure via a circuit pattern mask designed so as not to shade the light from the through-hole portion.

The following Examples illustrate this invention in more detail. Parts and percentages in Examples are all by weight.

SYNTHESIS EXAMPLE 1

A four-necked flask was charged with 269 parts of ortho-naphthoquinonediazidesulfonyl chloride and 1345 parts of dioxane, and with stirring at room temperature, 150 parts of N-methylethanolamine was added dropwise over 1 hour. After the dropwise addition, the mixture was stirred further for about 3 hours. After determining that the absorption of the amino group near 3300 $cm^{-1}$ in the IR spectrum of the reaction mixture disappeared, the reaction was terminated.

The resulting solution was put in deionized water, and the quaternary amine which trapped hydrochloric acid formed during the reaction was removed. The product was then extracted with isobutyl acetate, and the solvent was evaporated. The residue was dried in a dessicator under reduced pressure to give a hydroxyl-containing ortho-quinonediazide compound I.

SYNTHESIS EXAMPLE 2

A four-necked flask was charged with 269 parts of ortho-naphthoquinonediazidesulfonyl chloride and 1345 parts of dioxane, and with stirring at room temperature, 122 parts of monoethanolamine was added over the course of 1 hour. After the dropwise addition, the mixture was further stirred for about 3 hours, and then worked up as in the production of the quinonediazide compound I. As a result, a hydroxyl-containing ortho-quinonediazide compound II was obtained.

SYNTHESIS EXAMPLE 3

A four-necked flask was charged with 122 parts of mono-ethanolamine and 700 parts of methyl isobutyl ketone, and the mixture was heated under reflux with stirring. After reaction was continued for 5 hours while removing water produced to out of the reaction system through a water separator attached to the flask, 400 parts of methyl isobutyl ketone was distilled off under reduced pressure to obtain ketiminated hydroxylamine I. The content of the ketimine compound was 74%.

SYNTHESIS EXAMPLE 4

A four-necked flask was charged with 137 parts of p-aminobenzoic acid and 600 parts of methyl isobutyl ketone, and the mixture was allowed to react in the same manner as in Synthesis Example 3 to obtain ketiminated p-aminobenzoic acid II. The content of the ketimine compound was 68.5%.

SYNTHESIS EXAMPLE 5

| | |
|---|---|
| n-butyl acrylate | 600 parts |
| Styrene | 200 parts |
| Acryloyl chloride | 200 parts |
| Benzoyl peroxide | 50 parts |

A flask was charged with 800 parts of dimethyldiglyme, and with stirring at 60° C., a mixture of the above formulation was Added dropwise over 3 hours. After the mixture was kept at 60° C. for 1 hour, a mixture of 50 parts of dimethyldiglyme and 10 parts of benzoyl peroxide was added dropwise over 1 hour. The resulting mixture was kept at 60° C. for 3 hours to obtain an acid chloride-containing acrylic resin I. Solids content was 54%.

SYNTHESIS EXAMPLE 6

| | |
|---|---|
| n-Butyl acrylate | 490 parts |
| Ethyl acrylate | 200 parts |
| Styrene | 200 parts |
| Acrylic acid | 110 parts |
| Azobisisobutyronitrile | 100 parts |

A flask was charged with 500 parts of dimethyldiglyme, and with stirring at 110° C., a mixture of the above formulation was added dropwise over 3 hours. After the mixture was kept at 110° C. for 1 hour, a mixture of 50 parts of dimethyldiglyme and 10 parts of azobisisobutyronitrile was added dropwise over 1 hour, and the mixture was kept at 110° C. for further 3 hours to obtain a varnish having a solids content of 64.5%. Then, the varnish thus obtained was cooled to room temperature, and 300 parts of thionyl chloride was added thereto. When generation of hydrogen chloride was almost over the mixture was heated at about 60° C. for 1 hours. Thereafter, the temperature was elevated gradually to 120° C. under reduced pressure to remove unused thionyl chloride, thereby obtaining an acid chloride-containing acrylic resin II. Its solids content was 65.1%.

SYNTHESIS EXAMPLE 7

A four-necked flask was charged with 307 parts of hydroxyl group-containing orthoquinonediazide compound I and 222 parts of isophoronediisocyanate, and the mixture was stirred at 50° C. for 5 hours to obtain an isocyanate group-containing orthoquinonediazide compound.

PREPARATION EXAMPLE 1

| | |
|---|---|
| Acid chloride-containing acrylic resin I (Synthesis Example 5) | 1,000 parts |
| Hydroxyl group-containing orthoquinonediazide compound I (Synthesis Example 1) | 306 parts |
| Dimethyldiglyme | 600 parts |

The above mixture was charged in a flask, and stirred, and while keeping the temperature inside the vessel at 40° C. or lower, 150 parts of triethylamine was added dropwise over 3 hours, and the resulting mixture was kept at 50° C. for further 3 hours. The reaction product was poured in a large amount of water and precipitates were separated, which were extracted with 500 parts of dimethyldiglyme to obtain a photosensitive resin solution I. The resin had a number average molecular weight of 24,000, and a photosensitive group content of 1.24 mole/kg, and the solution had a solids content of 62%.

PREPARATION EXAMPLE 2

| | |
|---|---|
| Terephthalyl chloride | 102 parts |
| Hydroxyl group-containing orthoquinonediazide compound I (Synthesis Example 1) | 306 parts |
| Dimethyldiglyme | 2,000 parts |

The above mixture was charged in a flask, and stirred, and while keeping the temperature inside the vessel at 40° C. or lower, 150 parts of triethylamine was added dropwise over 3 hours, and the resulting mixture was kept at 50° C. for further 3 hours. The reaction product was poured in a large amount of water and precipitates were separated, which were dried under reduced pressure at room temperature to obtain a photosensitive compound I having a photosensitive group content of 2.70 moles/kg.

PREPARATION EXAMPLE 3

| | |
|---|---|
| Acid chloride-containing acrylic resin II (Synthesis Example 6) | 1,000 parts |
| Hydroxyl group-containing orthoquinonediazide compound II (Synthesis Example 2) | 88 parts |
| Dimethyldiglyme | 300 parts |

The above mixture was charged in a flask, and stirred, and while keeping the temperature inside the vessel at 40° C. or lower, 50 parts of diethylamine was added dropwise over 3 hours, and the resulting mixture was kept at 50° C. for further 3 hours. The reaction product was poured in a large amount of water and precipitates were separated. After they were well washed with water, the precipitates were dried in a vacuum drier to obtain a photosensitive resin II. The resin obtained had a number average molecular weight of 15,000, and a photosensitive group content of 0.41 mole/kg, and a carboxyl group content of 0.953 mole/kg.

PREPARATION EXAMPLE 4

| | |
|---|---|
| n-Butyl acrylate | 400 parts |
| Styrene | 200 parts |
| 2-hydroxyethyl methacrylate | 200 parts |
| Methyl methacrylate | 200 parts |
| Azobisisobutyronitrile | 80 parts |

A flask was charged with 800 parts of methyl isobutyl ketone, and with stirring at 110° C., a mixture of the above formulation was added dropwise over 3 hours. After the mixture was kept at 110° C. for 1 hour, a mixture of 50 parts of methyl isobutyl ketone and 5 parts of azobisisobutyronitrile was added dropwise over 1 hour, and the resulting mixture was kept at 110° C. for further 3 hours. Then, 550 parts of dimethyldiglyme was added, and methyl isobutyl ketone was distilled off at 110° C. to replace the solvent to obtain a resin solution having a solids content of 64.5%.

PREPARATION EXAMPLE 5

| | |
|---|---|
| Isophthalic acid | 332 parts |
| Trimethylolpropane | 67 parts |
| Neopentyl glycol | 208 parts |

The above mixture was charged in a flask, heated to 230° C. with stirring and allowed to condense with dehydration at 230° C. for 6 hours to prepare polyester. Then, the reaction mixture was cooled to 140° C., and 77 parts of trimellitic anhydride was added thereto. After keeping for 1 hour, 300 parts of dimethyldiglyme was added to obtain an anion-forming group-containing resin solution I having a carboxyl group content of 1.31 moles/kg, a number average molecular weight of 4,500, and a solids content of 67%.

PREPARATION EXAMPLE 6

| | |
|---|---|
| n-Butyl acrylate | 300 parts |
| Methyl methacrylate | 150 parts |
| n-Butyl methacrylate | 250 parts |
| Styrene | 200 parts |
| Acrylic acid | 100 parts |
| Benzoyl peroxide | 75 parts |

A flask was charged with 800 parts of methyl isobutyl ketone, and with stirring at 60° C., a mixture of the above formulation was added dropwise over 3 hours. After the mixture was kept at 60° C. for 1 hours, a mixture of 50 parts of methyl isobutyl ketone and 5 parts of benzoyl peroxide was added dropwise over 1 hour, and the resulting mixture was kept at 60° C. for further 3 hours to obtain an anion-forming group-containing resin solution II having a carboxyl group content of 1.39 moles/kg, a number average molecular weight of 17,000, and a solids content of 54%.

PREPARATION EXAMPLE 7

| | |
|---|---|
| Resin solution (Preparation Example 4) | 1,000 parts |
| Ketiminated product II (Synthesis Example 4) | 250 parts |
| Dibutyltin oxide | 5 parts |

The above mixture was charged in a flask, and the temperature was elevated to 230° C. while distilling off methyl isobutyl ketone, and dehydration condensation was continued for 10 hours with removing water through a water separator. Thereafter, 550 parts of dimethyldiglyme and 100 parts of deionized water were added and the ketimine was distilled off with heating under reduced pressure while it was being hydrolyzed to replace the solvent. Then, 210 parts of orthonaphthoquinonediazidesulfonyl chloride and 1,000 parts of dioxane were added, and further 80 parts of triethylamine was added dropwise over 3 hours. After completion of dropwise addition, the mixture was stirred for further 3 hours. Then, the reaction mixture was poured in a large amount of a aqueous 1N hydrochloric acid solution to form precipitates. After they were washed with water, the precipitates were extracted with 500 parts of dioxane to obtain a photosensitive resin solution III. The resin had a number average molecular weight of 14,000, and a photosensitive group content of 0.85 mole/kg, and the solution had a solids content of 64.5%.

PREPARATION EXAMPLE 8

| | |
|---|---|
| Cresol novolak type epoxy resin[1)] | 1,000 parts |
| Ketiminated product II (Synthesis Example 4) | 1,280 parts |
| Tetraethylammonium bromide | 3.0 parts |
| Dimethyldiglyme | 500 parts |

[1)]Epoxy equivalent 220, a number average molecular weight about 1,000, produced by Yuka Shell Epoxy K.K.

The above mixture was charged in a flask and allowed to react at 100° C. for 8 hours. Then 100 parts of deionized water was added, and the mixture was heated under reduced pressure to hydrolyze ketimine while distilling off methyl isobutyl ketone which was being produced out of the reaction system. Then, 874 parts of orthobenzoquinonediazidesulfonyl chloride and 2,000 parts of dioxane were added to the reaction mixture in the flask cooled to room temperature, and kept at room temperature with stirring. After 410 parts of triethylamine was added dropwise over 5 hours, the resulting mixture was stirred for further 3 hours, and then the reaction mixture was poured in a large amount of deionized water to form precipitates, which were separated and dried under reduced pressure to obtain a photosensitive resin IV. The resin had a number average molecular weight of 2,200 and a photosensitive group content of 1.81 moles/kg.

PREPARATION EXAMPLE 9

| | |
|---|---|
| Anion-forming group-containing resin solution I (Preparation Example 5) | 1,000 parts |
| Ketiminated product I (Synthesis Example 3) | 87 parts |

The above mixture was charged in a flask and heated to 230° C. while distilling off methyl isobutyl ketone, and allowed to react at 230° C. for 10 hours with removing byproduced water out of the reaction system. Further, 18 parts of deionized was added and the mixture was heated under reduced pressure to hydrolyze ketimine with removing methyl isobutyl ketone which was being produced out of the reaction system. After the reaction mixture was cooled to room temperature, 121 parts of orthobenzoquinonediazidesulfonyl chloride and 600 parts of dioxane were added to the reaction mixture and 50 parts of 10% triethylamine was added dropwise over 3 hours with stirring, and further allowed to react at room temperature for 3 hours. The reaction mixture was poured in a large amount of deionized water to form precipitates, which were separated and dried under reduced pressure to obtain a photosensitive resin V. The resin had a number average molecular weight of 5,200, a photosensitive group content of 0.56 mole/kg, and a carboxyl group content of 0.535 mole/kg.

PREPARATION EXAMPLE 10

| | |
|---|---|
| Methyl methacrylate | 150 parts |
| n-Butyl acrylate | 225 parts |
| 2-Hydroxyethyl methacrylate | 150 parts |
| Styrene | 100 parts |
| Dimethylaminoethyl methacrylate | 375 parts |
| t-Butyl peroxyoctoate | 87 parts |

A flask was charged with 500 parts of dimethyldiglyme, and with stirring at 60° C., a mixture of the above formulation was added dropwise over 3 hours. After the mixture was kept at 60° C. for 1 hour, a mixture of 50 parts of dimethyldiglyme and 10 parts of azobisisobutyronitrile was added dropwise over 1 hour, and the mixture was kept at 60° C. for further 3 hours to obtain a cation-forming group-containing resin solution I. The resin had a number average molecular weight of 12,000, and an amino group content of 2.0 moles/kg, and the solution had a solids content of 64.5%.

PREPARATION EXAMPLE 11

| | |
|---|---|
| Methyl methacrylate | 150 parts |
| Acrylic acid | 150 parts |
| n-Butyl acrylate | 350 parts |
| Styrene | 200 parts |
| 2-Hydroxyethyl methacrylate | 150 parts |
| Azobisisobutyronitrile | 50 parts |

A flask was charged with 500 parts of dimethyldiglyme, and with stirring at 110° C., a mixture of the above formulation was added dropwise over 3 hours. After the mixture was kept at 110° C. for 1 hour, a mixture of 50 parts of dimethyldiglyme and 5 parts of azobisisobutyronitrile was added dropwise over 1 hour, and the mixture was kept at 110° C. for further 3 hours to obtain an anion-forming group-containing resin solution III. The resin had a number average molecular weight of 21,000, and a carboxyl group content of 2.08 moles/kg, and the solution had a solids content of 64.5%.

PREPARATION EXAMPLE 12

A four necked flask was charged with 315 parts of diethylene glycol dimethyl ether, and the temperature was elevated to 110° C. with stirring. Then, a mixed solution of 122 parts of n-butyl methacrylate, 36 parts of acrylic acid, 60 parts of hydroxyethyl methacrylate, and 14 parts of azobisdimethylvaleronitrile was added dropwise over 3 hours. After the mixture was kept at 110° C. for 1 hour, a mixed solution of 15 parts of diethylene glycol dimethyl ether and 2 parts of azobisdimethylvaleronitrile was added dropwise over 1 hour, and the mixture was kept at 110° C. for further 2 hours, and then the temperature was lowered to room temperature. After 245 parts of the isocyanate group-containing quinonediazide compound (Synthesis Example 7) and 0.04 part of dibutyltin diacetate were added and the mixture was kept for 3 hours at room temperature, IR spectral was performed and disappearance of absorption by isocyanate group near 2,250 $cm^{-1}$ was confirmed. Thus, a photosensitive resin solution VI was obtained. The resin had a number average molecular weight of 7,400, a photosensitive group content of 0.96 mole/kg, and a carboxyl group content of 1.05 moles/kg, and the solution had a solids content of 59%.

PREPARATION EXAMPLE 13

A four-necked flask was charged with 307 parts of hydroxyl group-containing quinonediazide compound I, 500 parts of dimethyldiglyme and 3 parts of dibutyltin laurate, and with stirring the mixture was heated to 60° C. To this was added 185 parts of an aliphatic polyisocyanate (TAKENATE D-165N, isocyanate content: 22.7%, average molecular weight: about 650; produced by Takeda Chemical Industries, Ltd.) over 30 minutes, and the reaction was continued until absorption due to isocyanate group near 2,250 $cm^{-1}$ upon IR spectral analysis at 60° C. disappeared, and then dimethyldiglyme was distilled off at 60° C. under reduced pressure to a solids content of 60% to obtain a photosensitive compound solution II, which had a photosensitive group content of 2.0 moles/kg, and a solids content of 60%.

Table 1 below shows characteristics of the compounds or resins obtained in Preparation Examples 1 to 12.

TABLE 1

| Preparation Example | Content of Photosensitive Group mole/kg | Content of Carboxyl Group mole/kg | Content of Amino Group mole/kg | Solids Content | Molecular Weight |
|---|---|---|---|---|---|
| 1 | 1.24 | 0.26 | — | 62% | 24000 |
| 2 | 2.70 | — | — | 100 | 742 |
| 3 | 0.41 | 0.953 | — | 100 | 15000 |
| 4 | — | 1.54 (content of hydroxy group) | — | 64.5 | 12000 |
| 5 | — | 1.31 | — | 67 | 4500 |
| 6 | — | 1.39 | — | 54 | 17000 |
| 7 | 0.85 | — | — | 65 | 14500 |
| 8 | 1.81 | — | — | 100 | 2200 |
| 9 | 0.57 | 0.535 | — | 100 | 5200 |
| 10 | — | — | 2.0 | 64.5 | 12000 |
| 11 | — | 2.08 | — | 64.5 | 21000 |
| 12 | 0.96 | 1.05 | — | 59 | 7400 |
| 13 | 2.0 | — | — | 60 | 1700 |

EXAMPLE 1

| | |
|---|---|
| Photosensitive resin solution I (Preparation Example I) | 1,000 parts |
| Anion-forming group-containing resin solution II (Preparation Example 6) | 1,000 parts |
| Benzyl alcohol | 100 parts |
| NOIGEN EA120[2]) | 20 parts |

[2])Nonionic surfactant, produced by Daiichi Kogyo Seiyaku Co., Ltd.

After 57 parts of triethylamine was added to the above-described mixture with stirring for neutralization, 9423 parts of deionized water was added portionwise while stirring the mixture at 1,500 rpm using a disper to obtain a stable electrodeposition coating solution. This had a photosensitive group content of 0.66 mole/kg, a solids content of 10%, and a degree of neutralization of 62%.

A copper-clad laminate (substrate) having a 0.3 mmø copper-plated through-hole was dipped in a bath of the electrodeposition coating solution thus obtained kept at 28° C., and current of 60 mA/dm$^2$ was applied for 60 seconds between the laminate as anode and a counter electrode, and then the laminate (substrate) was taken out from the bath. After washing with water, the laminate was dried at 80° C. for 10 minutes for hydro-extraction to obtain a resist film having a film thickness of 8 μm. The coated film had a good appearance.

The through-hole portion of the resist film was light-shielded, and a polyester photo tool having black-and-white patterns with a line space of 30 μm/30 μm was contacted on other portions. The substrate was exposed to light (150 mj/cm$^2$) from a high pressure mercury lamp. The exposed substrate thus obtained was developed by spraying on it an aqueous 1% sodium carbonate solution kept at 20° C., 25° C., 30° C., 35° C., 40° C. or 45° C. Then, after the exposed copper was etched off with cupric chloride, the remaining resist film was removed with an aqueous 1% sodium hydroxide to obtain an etching pattern.

Test substrate obtained at temperatures within the development temperature range tested showed no peeling off or deficiency of pattern or remaining copper, and plating in the through-hole was in a complete state, thus giving an acceptable etching pattern.

The aforementioned electrodeposition bath, even after 6 month's storage at 5° C., showed no variation in appearance, electrodeposition characteristics, developability of resist film, etching characteristics, thus giving an acceptable etching pattern.

EXAMPLES 2 to 6

Preparation of electrodeposition baths, electrodeposition coating, exposure to light, development, and etching were performed in the same manner as in Example 1 using formulations and electrodeposition conditions shown in Table 2. Condition of patterns after etching and storage stability of the electrodeposition baths are shown in Table 3.

TABLE 2

| Example | Example 2 | | Example 3 | | Example 4 | | Example 5 | | Example 6[4] | |
|---|---|---|---|---|---|---|---|---|---|---|
| Electrodeposition bath | | | | | | | | | | |
| Resin (compound)<br>Amount (part) | Photosensitive compound I<br>300<br>Anion forming group-containing resin III<br>1,085 | | Photosensitive resin II<br>1,000<br>o-Cresol novolak resin<br>100 | | Photosensitive resin IV<br>250<br>Anion forming group-containing resin I<br>1,119 | | Photosensitive resin V<br>1,000 | | Photosensitive resin III<br>461<br>Cation forming group-containing resin I<br>620<br>Resin in Preparation Example 4<br>465 | |
| Neutralizing agent<br>Amount (part) | Triethylamine<br>66 | | Triethylamine<br>63 | | Dimethyl-ethanolamine<br>44 | | Triethylamine<br>54 | | Acetic acid<br>24 | |
| Solvent<br>Amount (part) | Hexylene glycol monoethyl ether<br>120<br>Benzyl alcohol<br>200 | | Methoxypropanol<br>600<br>Butylcarbitol<br>200 | | Dimethyldiglyme<br>200<br>Dibutyldiglyme<br>100 | | Dimethyldiglyme<br>600<br>Dibutyldiglyme<br>150 | | Butylcellosolve<br>400 | |
| Additive<br>Amount (part) | Benzotriazole<br>15 | | NOIGEN EA-142[3]<br>20 | | | | | | | |
| Aqueous medium<br>Amount (part) | Deionized water<br>8,414 | | Deionized water<br>5,350 | | Deionized water<br>6,620 | | Deionized water<br>4,863 | | Deionized water<br>8,030 | |
| Neutralization equivalent | 0.45 | | 0.65 | | 0.65 | | 1.00 | | 0.50 | |
| Photosensitive group content (mole/kg) | 0.81 | | 0.37 | | 0.45 | | 0.57 | | 0.255 | |
| Solids content (%) | 10 | | 15 | | 12 | | 15 | | 10 | |
| Condition of Electrodeposition | | | | | | | | | | |
| 5° C. Storage | Before | After 6 months | Before | After 6 months | Before | After 6 months | Before | After 6 months | Before | After 6 months |
| Current density ($mA/dm^2$) | 60 | 60 | 80 | 80 | 45 | 45 | 60 | 60 | 50 | 50 |
| Electrodeposition time (second) | 75 | 75 | 60 | 60 | 60 | 60 | 90 | 90 | 75 | 75 |
| Maximum applied voltage (V) | 110 | 120 | 130 | 130 | 95 | 90 | 130 | 130 | 110 | 115 |
| Film thickness (μm) | 9 | 8 | 10 | 10 | 6 | 6 | 14 | 13 | 9 | 9 |
| Coating film appearance | Good | Good | Good | Good | Good | Good | Good | Good | Good | Good |

Notes:
[3]Nonionic surfactant, produced by Daiichi Kogyo Seiyaku Co., Ltd.
[4]Electrodeposition was performed using the substrate as anode.

TABLE 3

| | Example | | | | |
|---|---|---|---|---|---|
| | 2 | 3 | 4 | 5 | 6 |
| Developability Temperature of developer | | | | | |
| 20° C. | Good | Good | Good | Good | Good |
| 25° C. | " | " | " | " | " |
| 30° C. | " | " | " | " | " |
| 35° C. | " | " | " | " | " |
| 40° C. | " | " | " | " | " |
| 45° C. | " | " | " | " | " |
| State of pattern after etching | Good for all development region | " | " | " | " |
| Storage stability of electrodeposition bath | No change in appearance in electrodeposition characteristics | " | " | " | " |

TABLE 3-continued

| | Example | | | | |
|---|---|---|---|---|---|
| | 2 | 3 | 4 | 5 | 6 |
| (5° C., 6 months) | developability and etching characteristics | | | | |

COMPARATIVE EXAMPLE 1

Triethylamine (38 parts) was added to 800 parts of photosensitive resin solution VI (Preparation Example 12) to neutralize well, and then deionized water was added to a solids content of 10% to obtain an electrodeposition coating bath. Using the electrodeposition bath, electrodeposition was performed in the same manner as in Example 1 to obtain a resist film of 6 μm thick. This was exposed to light, developed and etched in the same manner as in Example 1. When the exposed resist film was developed with an aqueous 1% sodium carbonate solution, development failure resulted at a developer temperature of 30° C. or lower. When the aforementioned electrodeposition bath was stored at 5° C., precipitates appeared in the electrodeposition bath in 3 months, and spitting occurred in the resulting electrodeposition film. Further, the resist film showed decreased developability, and it took 1 minutes or more for development at 45° C. Furthermore, development at 50° C. for 1 minute resulted in partial failure due to breakage of pattern.

COMPARATIVE EXAMPLE 2

| | |
|---|---|
| Photosensitive compound solution II (Preparation Example 13) | 500 parts |
| Photosensitive compound III[5] | 6,582 parts |
| Anion-forming group-containing resin solution III (Preparation Example II) | 1,085 parts |
| Benzyl alcohol | 100 parts |

[5]tri-1,2-naphthoquinonediazide-5-sulfonic acid ester of 2,3,4-trihydroxybenzophenone, solids content: 100%, quinonediazidesulfonic unit: 75.2% (about 3.0 unit/molecule)

Triethylamine (66 parts) was added to the above mixture and stirred for neutralization, and then deionized water was added to a solids content of 10% to obtain an electrodeposition coating bath. Using the electrodeposition bath, electrodeposition was performed in the same manner as in Example 1 to obtain a resist film of 8 μm thick. This was exposed to light, developed and etched in the same manner as in Example 1. When the exposed resist film was developed with an aqueous 1% sodium carbonate solution, development failure resulted at a developer temperature of 35° C. or lower. When the aforementioned electrodeposition bath was stored at 5° C., precipitates appeared in the electrodeposition bath in 2 months, and spitting occurred in the resulting electrodeposition film. Further, the resist film showed decreased developability, and it took 1 minute for development at 50° C. Furthermore, development at 50° C. for 1 minute or more resulted in partial failure due to breakage of pattern.

What is claimed is:

1. A positive-type photosensitive electrodeposition coating composition comprising:

(A) a photosensitive compound or a photosensitive resin containing at least one modified quinonediazidesulfone unit represented by the following formula (I) or (II)

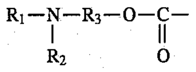

(I)

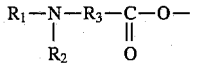

(II)

wherein $R_1$ represents

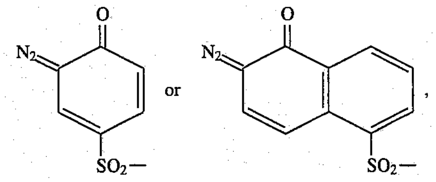

$R_2$ represents a hydrogen atom, an alkyl group, a cycloalkyl group or an alkyl ether group, and $R_3$ represents at least one member selected from the group consisting of an alkylene group, a cycloalkylene group, an alkylene ether group, a phenylene group, a phenylene group substituted with an alkyl group having 1 to 20 carbon atoms, an alkylene group containing in its chain a phenylene group, an alkylene group containing in its chain a phenylene group substituted with an alkyl group having 1 to 20 carbon atoms, a cycloalkylene group containing in its chain a phenylene group, a cycloalkylene group containing in its chain a phenylene group substituted with an alkyl group having 1 to 20 carbon atoms, an alkylene ether group containing in its chain a phenylene group, and an alkylene ether group containing in its chain a phenylene group substituted with an alkyl group having 1 to 20 carbon atoms, said modified quinonediazidesulfone unit being connected to the compound or the resin by a carboxylic acid ester linkage, and (B) a water-soluble or water-dispersible resin having a salt-forming group, the content of the quinonediazidesulfone unit in the photosensitive compound or the photosensitive resin (A) being 0.1 to 1.0 mole/kg, based on the total amount of the compound or the resin (A) and the resin (B), and the resin (B) having 0.45 to 4.0 moles/kg of the salt-forming group, based on the total amount of the compound or the resin (A) and the resin (B).

2. The composition of claim 1 in which $R_2$ is an alkyl group having 1 to 6 carbon atoms.

3. The composition of claim 2 in which $R_2$ is a methyl group.

4. The composition of claim 1 in which $R_3$ is a linear alkylene group having 2 to 6 carbon atoms.

5. The composition of claim 1 in which $R_3$ is a phenylene group whose benzene nucleus may be substituted with 1 to 3 lower alkyl groups.

6. The composition of claim 1 in which the modified quinonediazidesulfonic acid unit represented by formula (I)

is obtained by the reaction of the acid halide compound with a hydroxyl-containing quinonediazide compound represented by the following formula

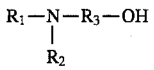

wherein $R_1$, $R_2$ and $R_3$ are as defined in claim 1.

7. The composition of claim 1 in which said modified quinonediazidesulfone unit represented by formula (I) is obtained by ketiminating an amino group in a hydroxyl group-containing amine compound represented by the following formula:

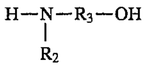

wherein $R_2$ and $R_3$ are as defined in claim 1, to form a ketimine bond; reacting said hydroxyl group in said hydroxyl group-containing amine compound with a carboxyl group in an aliphatic, alicyclic or aromatic carboxylic acid, a carboxylic acid anhydride group in an aromatic carboxylic anhydride, or a carboxyl group or carboxylic acid anhydride group in said resin; hydrolyzing said ketimine bond to reproduce an amino group; and reacting said reproduced amino group with a quinonediazidesulfonyl halide.

8. The composition of claim 1 in which said modified quinonediazidesulfone unit represented by formula (II) is obtained by ketiminating an amino group in an aminocarboxylic acid represented by the following formula

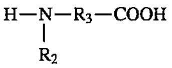

wherein $R_2$ and $R_3$ are as defined in claim 1, to form a ketimine bond; reacting said carboxyl group in said aminocarboxylic acid with an epoxy group in an aliphatic, alicyclic or aromatic glycidyl compound, with a hydroxyl group in an aliphatic or alicyclic alcohol, or phenol, or with an epoxy group or a hydroxyl group in said resin; hydrolyzing said ketimine bond to reproduce an amino group; reacting said amino group with a quinonediazidesulfonyl halide.

9. The composition of claim 1 in which the photosensitive compound or the photosensitive resin (A) has a number average molecular weight of not more than 50,000.

10. The composition of claim 1 in which the water-soluble or water-dispersible resin (B) has an anionic group selected from a carboxyl group, a sulfonyl group and a phosphoric acid group.

11. The composition of claim 1 in which the water-soluble or water-dispersible resin (B) has a cationic group selected from an amino group, an ammonium salt group, a sulfonium group and a phosphonium salt group.

12. The composition of claim 1 in which the water-soluble or water-dispersible resin (B) has a number average molecular weight of 1,500 to 100,000.

13. The composition of claim 1 which further comprises not more than 100 parts by weight, per 100 parts by weight of the mixture of the compound or the resin (A) and the water-soluble or water-dispersible (B), of a hydrophilic solvent.

14. The composition of claim 1 which further comprises not more than 30 parts by weight, per 100 parts by weight of the mixture of the compound or the resin (A) and the water-soluble or water-dispersible resin (B), of a hydrophobic solvent.

* * * * *